(12) United States Patent
Takanashi et al.

(10) Patent No.: US 9,090,783 B2
(45) Date of Patent: Jul. 28, 2015

(54) PROTECTIVE FILM AGENT FOR LASER DICING AND WAFER PROCESSING METHOD USING THE PROTECTIVE FILM AGENT

(75) Inventors: Hiroshi Takanashi, Kanagawa-ken (JP); Atsushi Kawakami, Kanagawa-ken (JP); Toshiyuki Yoshikawa, Tokyo (JP); Nobuyasu Kitahara, Tokyo (JP)

(73) Assignees: TOKYO OHKA KOGYO CO., LTD., Kawasaki-Shi, Kanagawa-Ken (JP); DISCO CORPORATION, Tokyo (JP)

( * ) Notice: Subject to any disclaimer, the term of this patent is extended or adjusted under 35 U.S.C. 154(b) by 894 days.

(21) Appl. No.: 12/707,102

(22) Filed: Feb. 17, 2010

(65) Prior Publication Data

US 2010/0304551 A1   Dec. 2, 2010

Related U.S. Application Data

(63) Continuation of application No. 11/251,810, filed on Oct. 18, 2005, now abandoned.

(30) Foreign Application Priority Data

Nov. 12, 2004 (JP) ................................. 2004-328400

(51) Int. Cl.
*B23K 26/00* (2014.01)
*B23K 26/16* (2006.01)
*C09D 5/32* (2006.01)
*B23K 26/40* (2014.01)
*H01L 21/67* (2006.01)

(52) U.S. Cl.
CPC .............. *C09D 5/32* (2013.01); *B23K 26/4075* (2013.01); *H01L 21/67092* (2013.01); *B23K 2201/40* (2013.01)

(58) Field of Classification Search
CPC ... B23K 2201/40; B23K 26/4075; C09D 5/32
USPC ......................................... 219/121.6–121.86
See application file for complete search history.

(56) References Cited

U.S. PATENT DOCUMENTS

| 6,258,426 B1 | 7/2001 | Yamamoto et al. |
| 7,138,297 B2 | 11/2006 | Iijima et al. |
| 2002/0001773 A1 | 1/2002 | Saito et al. |
| 2004/0112880 A1 | 6/2004 | Sekiya |
| 2005/0106782 A1 | 5/2005 | Genda et al. |
| 2005/0153079 A1 | 7/2005 | Hieda et al. |

FOREIGN PATENT DOCUMENTS

| DE | 10 2004 055 443 | 6/2005 |
| JP | 53-8634 | 1/1978 |
| JP | 5-211381 | 8/1993 |
| JP | 2004-188475 | 7/2004 |
| JP | 2004-221286 | 8/2004 |

*Primary Examiner* — Sang Y Paik
(74) *Attorney, Agent, or Firm* — Smith, Gambrell & Russell LLP.

(57) ABSTRACT

A protective film agent for laser dicing according to the present invention comprises a solution having, dissolved therein, a water-soluble resin and at least one laser light absorber selected from the group consisting of a water-soluble dye, a water-soluble coloring matter, and a water-soluble ultraviolet absorber. The protective film agent is coated on a surface of a wafer, which is to be processed, and is then dried to form a protective film. Laser dicing through the protective film produces chips from the wafer. As a result, deposition of debris can be effectively prevented on the entire face of the chips, including their peripheral edge portions.

5 Claims, 9 Drawing Sheets

(a)

(b)

(a)

(b)

PROTECTIVE FILM AGENT FOR LASER DICING AND WAFER PROCESSING METHOD USING THE PROTECTIVE FILM AGENT

CROSS REFERENCE TO RELATED APPLICATION

This application is a continuation of Ser. No. 11/251,810, filed Oct. 18, 2005, now abandoned, and which is being incorporated in its entirety herein by reference.

BACKGROUND OF THE INVENTION

1. Field of the Invention

This invention relates to a protective film agent for use in laser dicing which applies a laser beam to a predetermined region of a wafer, such as a semiconductor wafer, to carry out predetermined processing, and a processing method by laser dicing using the protective film agent.

2. Description of the Related Art

As is well known among those skilled in the art, a wafer formed in a semiconductor device manufacturing process has a laminate, which comprises an insulating film and a functional film stacked on the face of a semiconductor substrate, such as silicon, partitioned by a lattice of scheduled division lines, called streets. Respective regions partitioned by the streets define semiconductor chips such as IC's or LSI's. That is, a plurality of semiconductor chips are obtained by cutting the wafer along the streets. An optical device wafer has a laminate, which comprises a gallium nitride-based compound semiconductor or the like stacked on the face of a sapphire substrate or the like, partitioned into a plurality of regions by streets. When cut along these streets, the optical device wafer is divided into optical devices, such as light emitting diodes or laser diodes. These optical devices find wide use in electrical equipment.

Such cutting of the wafer along the streets is usually performed by a cutting device called a dicer. This cutting device comprises a chuck table for holding the wafer, which is a workpiece, cutting means for cutting the wafer held on the chuck table, and moving means for moving the chuck table and the cutting means relative to each other. The cutting means includes a rotating spindle to be rotated at a high speed, and a cutting blade mounted on the spindle. The cutting blade comprises a disk-shaped base, and an annular cutting edge mounted on an outer peripheral portion of the side surface of the base. The cutting edge, for example, comprises diamond abrasive grains, which have a grain size of the order of 3 μm, fixed to the outer peripheral portion of the side surface of the base by electroforming, and is formed in a thickness of the order of 20 μm.

The wafer having the above-described laminated structure is a high brittleness material. Thus, the wafer has posed the problems that when the wafer is cut into semiconductor chips by the cutting blade (cutting edge), flaws, scratches or chipping occurs, causing the peeling of the insulating film required of circuit elements formed on the faces of the chips.

To avoid the above problems, it is currently becoming common practice to apply laser light along the streets prior to cutting with the cutting blade, thereby forming grooves commensurate with the width of the cutting blade (cutting edge), and then to perform cutting with the blade.

When laser light is applied along the streets of the wafer, however, the new problem has arisen that the laser light is absorbed, for example, into the silicon substrate, and its thermal energy leads to the melting or thermal decomposition of silicon, thus generating a silicon vapor, etc., which are condensed and deposited on the faces of the chips. The resulting condensation deposit (debris) of the silicon vapor, etc. markedly deteriorates the quality of the semiconductor chips.

To resolve the problem due to debris, Japanese Patent Application Laid-Open No. 1978-8634 (hereinafter referred to as Patent Document 1) and Japanese Patent Application Laid-Open No. 1993-211381 (hereinafter referred to as Patent Document 2) propose methods in which a protective film comprising a water-soluble resin is formed on a surface of a wafer to be processed, and this surface is irradiated with laser light via the protective film.

According to the methods of Patent Documents 1 and 2, the chip faces are protected with the protective film. Thus, even if a silicon vapor or the like, which is the thermal decomposition product of the substrate upon laser irradiation, scatters and condenses, its condensate (debris) deposits on the surface of the protective film, and does not deposit on the chip faces. Since the protective film is water-soluble, moreover, it can be easily removed by washing with water. That is, the debris on the protective film is washed away simultaneously with the washing of the protective film with water. As a result, deposition of the debris on the chip faces can be prevented.

With the foregoing methods, however, it is still impossible to prevent the deposition of debris completely, and the problem occurs that debris deposits on peripheral edge portions of the chips, in particular. The following mechanism may be involved: Upon irradiation with laser light, thermal decomposition of the substrate proceeds prior to the thermal decomposition of the protective film, and the pressure of a silicon vapor or the like, which is its thermal decomposition product, causes voids to be formed between the protective film and the peripheral edge portions of the chip faces (in the vicinity of the street lines) (in other words, partial peeling of the protective film takes place at the peripheral edge portions). As a result, debris deposition occurs at the peripheral edge portions of the chip faces. The problem also exists that the adhesion of the protective film to the wafer face is so low that the protective film is prone to peel off. Such peeling is another factor for easy deposition of debris on the peripheral edge portions of the chip faces.

SUMMARY OF THE INVENTION

It is an object of the present invention, therefore, to provide a protective film agent for laser dicing, which can form a protective film having high adhesion to the face of a wafer, and being capable of effectively preventing deposition of debris on the entire face of chips, including their peripheral edge portions, in producing the chips from the wafer by laser dicing, and also to provide a method for processing the wafer with the use of the protective film agent.

According to an aspect of the present invention, there is provided a protective film agent for laser dicing, comprising a solution having, dissolved therein, a water-soluble resin and at least one laser light absorber selected from the group consisting of a water-soluble dye, a water-soluble coloring matter, and a water-soluble ultraviolet absorber.

In the protective film agent of the present invention, it is preferred that (1) the g absorption coefficient k, for laser light with a wavelength of 355 nm, of the solids of the solution be within the range of $3 \times 10^{-3}$ to $2.5 \times 10^{-1}$ abs·L/g (abs: absorbance); and (2) the laser light absorber be contained in an amount of 0.01 to 10 parts by weight based on 100 parts by weight of the water-soluble resin.

According to another aspect of the present invention, there is provided a processing method for a wafer, comprising coating a surface of the wafer, which is to be processed, with the above-mentioned protective film agent for laser dicing, followed by drying, to form a protective film, and irradiating the surface, which is to be processed, with laser light via the protective film to perform processing.

The processing method of the present invention may generally adopt the following measures:

(3) The wavelength of the laser light is 355 nm.

(4) In the wafer, a plurality of semiconductor chips partitioned by streets arranged in a lattice pattern are formed, and the streets are irradiated with the laser light via the protective film to form grooves.

(5) After irradiation with the laser light, the protective film is removed by washing with water.

The protective film agent for laser dicing according to the present invention contains the water-soluble laser light absorber in addition to the water-soluble resin. Thus, a protective film, which is formed on the face of the wafer by coating and drying the protective film agent, shows high absorption of laser light and, when irradiated with laser light, is promptly thermally decomposed to be laser-processed along the street lines. Hence, peeling of the protective film, which occurs under the pressure of a vapor, etc. of the thermal decomposition product of the substrate upon exposure to laser light, can be effectively prevented. Furthermore, the water-soluble dye, etc., which are used as the water-soluble laser light absorbers, all have high affinity for the wafer face. Thus, the adhesion of the protective film has been enhanced, and peeling of the protective film from the wafer face, particularly, in the vicinity of the street lines is effectively suppressed. Accordingly, the protective film is formed by the protective film agent of the present invention, and laser dicing is performed by irradiation with laser light, whereby the deposition of debris can be effectively prevented throughout the faces of the diced chips.

Generally, laser light having a wavelength of 355 nm is used. In performing dicing with the use of such laser light, the amount of the laser light absorber used is adjusted such that the g absorption coefficient k of the protective film (the solids of the above solution) is within the range of $3 \times 10^{-3}$ to $2.5 \times 10^{-1}$ abs·L/g (abs: absorbance). By so doing, uniform processing can be achieved along the street lines of a fine line width.

DETAILED DESCRIPTION OF THE INVENTION

Protective Film Agent

Figure 1:
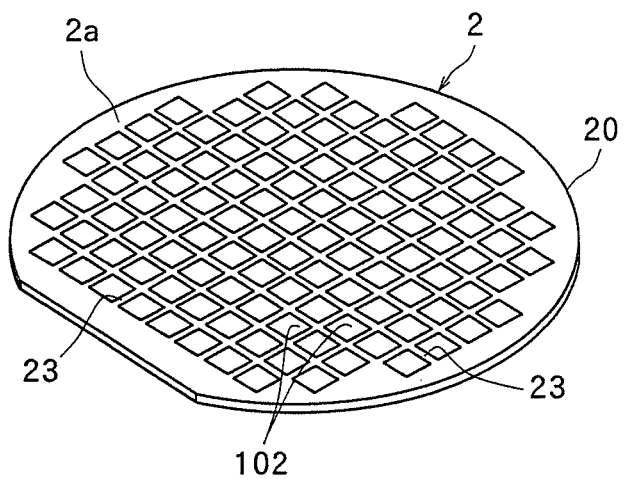
FIG. 1 is a perspective view showing a semiconductor wafer which is processed by the wafer processing method using the protective film agent of the present invention.

The protective film agent of the present invention comprises a solution containing a water-soluble resin and a water-soluble laser light absorber.

The water-soluble resin serves as a matrix for a protective film, and is not limited, if it is a material which can form a film when dissolved in a solvent, such as water, coated and dried. Its examples include polyvinyl alcohol, polyvinyl pyrrolidone, polyethylene glycol with 5 or more oxyethylene recurring units, polyethylene oxide, methylcellulose, ethylcellulose, hydroxypropyl cellulose, polyacrylic acid, polyvinyl alcohol-polyacrylic acid block copolymer, polyvinyl alcohol-polyacrylic acid ester block copolymer, and polyglycerin. These resins can be used alone or in combination of two or more.

The protective film formed on the wafer face in the present invention is removed by washing with water after laser processing. If the water-washability of the protective film is taken into consideration, it is preferred to use a resin having only an ether linkage or a hydroxyl group as a polar group, for example, polyvinyl alcohol or polyethylene glycol, as the aforementioned water-soluble resin. This is because a water-soluble resin having a polar group, such as a carboxyl group or a tertiary amine, tends to bind firmly to the wafer face (chip face), and is likely to remain on the wafer face after washing with water. The resin having only an ether linkage or a hydroxyl group, on the other hand, has relatively weak adhesiveness, and its remaining after washing with water can be effectively avoided. In terms of the washability with water, the polymerization degree or molecular weight of the water-soluble resin used is preferably lower. If polyvinyl alcohol is taken as an example, its polymerization degree is preferably of the order of 300. However, the water-soluble resin with a high polymerization degree or a high molecular weight has low washability with water, but in this case, a decline in water-washability can be avoided by using a plasticizer (to be described later) concomitantly.

As the laser light absorber used in combination with the above-mentioned water-soluble resin, a water-soluble dye, a water-soluble coloring matter, and a water-soluble ultraviolet absorber are used. These agents are all water-soluble, and are advantageously present uniformly in the protective film. Moreover, they show high affinity for the wafer face, and can form a protective film highly adherent to the wafer face. Furthermore, they are advantageous in that their solutions have high storage stability and, during storage, cause no disadvantage, such as phase separation or sedimentation, and can ensure satisfactory coating properties. If a water-insoluble laser light absorber, such as a pigment, is used, for example, there will be variations in the laser absorption capacity of the protective film, or storage stability or coating properties will be poor, making it difficult to form a uniformly thick protective film.

As the above water-soluble dye in the present invention, a water-soluble dye is selected, for example, from among azo dyes (monoazo and polyazo dyes, metal complex salt azo dyes, pyrazolone azo dyes, stilbene azo dyes, thiazole azo dyes), anthraquinone dyes (anthraquinone derivatives, anthrone derivatives), indigoid dyes (indigoid derivatives, thioindigoid derivatives), phthalocyanine dyes, carbonium dyes (diphenylmethane dyes, triphenylmethane dyes, xanthene dyes, acridine dyes), quinoneimine dyes (azine dyes, oxazine dyes, thiazine dyes), methine dyes (cyanine dyes, azomethine dyes), quinoline dyes, nitroso dyes, benzoquinone dyes and naphthoquinone dyes, naphthalimide dyes, perinone dyes, and other dyes.

As the water-soluble dyes, dyes as food additives, for example, Food Red No. 2, Food Red No. 40, Food Red No. 102, Food Red No. 104, Food Red No. 105, Food Red No. 106, Food Yellow NY, Food Yellow No. 4 tartrazine, Food Yellow No. 5, Food Yellow No. 5 Sunset Yellow FCF, Food Orange AM, Food Vermillion No. 1, Food Vermillion No. 4, Food Vermillion No. 101, Food Blue No. 1, Food Blue No. 2, Food Green No. 3, Food Melon Color B, and Food Egg Color No. 3 are preferred from the viewpoint of environmental load, etc.

Examples of the water-soluble ultraviolet absorber are 4,4'-dicarboxybenzophenone, benzophenone-4-carboxylic acid, 2-carboxyanthraquinone, 1,2-naphthalenedicarboxylic acid, 1,8-naphthalenedicarboxylic acid, 2,3-naphthalenedicarboxylic acid, 2,6-naphthalenedicarboxylic acid, and 2,7-naphthalenedicarboxylic acid and sodium salt, potassium salt, ammonium salt, and quaternary ammonium salt thereof, 2,6-anthraquinonedisulfonic acid sodium salt, 2,7-anthraquinonedisulfonic acid sodium salt, and ferulic acid. Of these substances, ferulic acid is preferred.

In the present invention, the above-mentioned water-soluble laser light absorber is used in such an amount that the desired laser light absorption capacity can be ensured. If processing is performed using laser light with a wavelength of 355 nm, for example, the water-soluble laser light absorber is preferably used in such an amount that the g absorption coefficient k of the protective film (the solids of the solution) is within the range of $3 \times 10^{-3}$ to $2.5 \times 10^{-1}$ abs·L/g (abs: absorbance). If this g absorption coefficient k is lower than the above range, the laser light absorption capacity of the protective film is so low that the thermal decomposition of the protective film by irradiation with laser light lags considerably behind the substrate such as silicon. As a result, peeling of the film and so on due to the pressure of a vapor of the thermal decomposition product are apt to occur, and debris tends to form at the peripheral edge portions of the chips. If the g absorption coefficient k is higher than the above range, the thermal decomposition of the protective film easily takes place even owing to the reflection of laser light from the substrate upon laser light application. Thus, the processing width of laser becomes larger than the laser spot diameter. This is likely to be unsuitable, particularly, for dicing along the streets of a very small line width.

If the laser light absorber, in whose maximum absorption wavelength region the wavelength of laser light used belongs, is selected and used, the use of its small amount enables the g absorption coefficient k within the above-described range to be secured. If the laser light absorber, which fails to meet this condition, is chosen and used, it has to be used in a large amount in order to secure the g absorption coefficient k within the above-described range. However, if the amount of the laser light absorber used is too large, phase separation may be caused between the laser light absorber and the water-soluble resin, when the solution containing it is coated and dried to form the protective film. If the amount of the laser light absorber used is too small, the laser light absorber may be unevenly distributed in the protective film. Generally, therefore, it is preferred to select the laser light absorber so that its amount used of 0.01 to 10 parts by weight based on 100 parts by weight of the water-soluble resin enables the g absorption coefficient k within the above-described range to be secured.

In the present invention, other compounding agents can be dissolved, in addition to the above-mentioned water-soluble resin and laser light absorber, in the solution for use as the protective film agent. For example, a plasticizer and a surface active agent can be used.

The plasticizer is used to enhance the water-washability of the protective film after laser processing. The plasticizer is preferably used, particularly when the water-soluble resin with a high molecular weight is used. The use of the plasticizer is also advantageous in that it can suppress the carbonization of the water-soluble resin due to irradiation with laser light. A water-soluble, low molecular weight compound is preferred as such a plasticizer. Its examples include ethylene glycol, triethylene glycol, tetraethylene glycol, ethanolamine, and glycerin. These compounds can be used alone or in combination of two or more. Such a plasticizer is used in such an amount that after coating and drying of the solution, phase separation does not occur between the plasticizer and the water-soluble resin. For example, its recommendable amount used is 75 parts by weight or less, especially 20 to 75 parts by weight, based on 100 parts by weight of the water-soluble resin.

The surface active agent is used to enhance the coating properties, and further to enhance the storage stability of the solution. Any surface active agents of the nonionic, cationic, anionic or ampholytic type can be used, if they are water-soluble.

Examples of the nonionic surface active agent are nonyl phenol-based, higher alcohol-based, polyhydric alcohol-based, polyoxyalkylene glycol-based, polyoxyethylene alkyl ester-based, polyoxyethylene alkyl ether-based, polyoxyethylene alkylphenol ether-based, and polyoxyethylene sorbitan alkyl ester-based surface active agents. Examples of the cationic surface active agent are quaternary ammonium salts and amine salts. Examples of the anionic surface active agent are alkylbenzenesulfonic acids and their salts, alkylsulfuric ester salts, methyltaurates, and ether sulfonates. Examples of the ampholytic surface active agent are imidazoliniumbetaine-based, amidopropylbetaine-based, and aminodipropionatebased surface active agents. One of, or a combination of two or more of, these surface active agents may be selected. The amount of any such surface active agent may be several tens of ppm or several hundred ppm based on the solution.

In the protective film agent for laser dicing of the present invention, which comprises the solution having the above-mentioned components dissolved therein, the solids content in the solution should be set in accordance with the type, the polymerization degree or the molecular weight of the water-soluble resin used so that the solution may have moderate coating properties. If the solids content is too high, for example, coating is difficult, resulting in a tendency toward an uneven thickness or entrapment of air bubbles. If the solids content is low, the solution, when coated on the wafer face, tends to drip, and the film thickness after drying (thickness of the protective film) is difficult to adjust. Thus, the solids content (the total content of the respective ingredients) in the solution is preferably set at a value of the order of 3 to 30% by weight, although it is different according to the water-soluble resin, etc. used. The amount of the water-soluble resin in the solids is generally 5% by weight or more. This is preferred in rendering the strength of the protective film appropriate, and preventing the deposition of debris on the chip faces.

The solvent for use in preparing the solution, which is the protective film agent of the present invention, may be a solvent in which the aforementioned water-soluble resin and water-soluble laser light absorber dissolve. Examples of the solvent are water, alcohols, esters, alkylene glycols, alkylene glycol monoalkyl ethers, and alkylene glycol monoalkyl ether acetates. Of them, water and alkylene glycol monoalkyl ethers are preferred. As the alkylene glycol monoalkyl ether, propylene glycol monomethyl ether (PGME) is preferred. The most preferred solvent for the work environment is water, or a mixed solvent containing water.

The above-described protective film agent of the present invention is coated on the surface of the wafer to be processed, for example, the surface of the wafer to be processed, where a plurality of semiconductor chips partitioned by streets arranged in a lattice layout are formed, followed by drying the coating, whereby the protective film is formed. The streets are irradiated with laser light via the protective film to form grooves (carry out laser dicing). The recommendable thickness of the protective film (the dry thickness of the protective film agent) is usually of the order of 0.1 to 5 μm on the streets. The reasons are as follows: Such a surface of the wafer to be processed has many dents and projections, and the streets are formed in these dents. Thus, if the above thickness is too small, the thickness of the protective film in the projections is so small that debris may enter the protective film and deposit on the chip faces. An unnecessarily large thickness, on the other hand, would bring no particular advantages, but would cause only such a disadvantage that washing with water after processing takes time.

An explanation will be offered below for the processing of the wafer by laser dicing with the use of the protective film agent according to the present invention.

Figure 2:
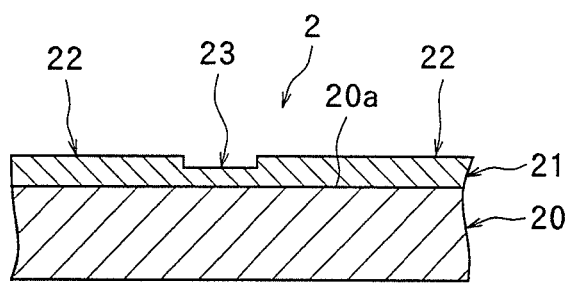
FIG. 2 is an enlarged sectional view of the semiconductor wafer shown in FIG. 1.

FIG. 1 shows a perspective view of a semiconductor wafer which is processed in accordance with the present invention. FIG. 2 shows an enlarged sectional view of the essential parts of the semiconductor wafer shown in FIG. 1. The semiconductor wafer 2 shown in FIGS. 1 and 2 has a plurality of semiconductor chips 22, such as IC's and LSI's, formed in a matrix form from a laminate 21, which comprises an insulating film and a circuit-forming functional film stacked on the face 20a of a semiconductor substrate 20 of silicon or the like. The respective semiconductor chips 22 are partitioned by streets 23 formed in a lattice pattern. In the illustrated embodiment, the insulating film constituting the laminate 21 is a low dielectric constant insulator film (Low-k film) comprising an $SiO_2$ film, or a film derived from an inorganic material such as SiOF or BSG (SiOB), or a film from an organic material which is a polymer such as polyimide or Parylene.

To perform laser processing along the streets 23 of the above-mentioned semiconductor wafer 2, the first step is to form a protective film on the face 2a, a surface of the semiconductor wafer 2 to be processed, with the use of the aforementioned protective film agent.

Figure 3:
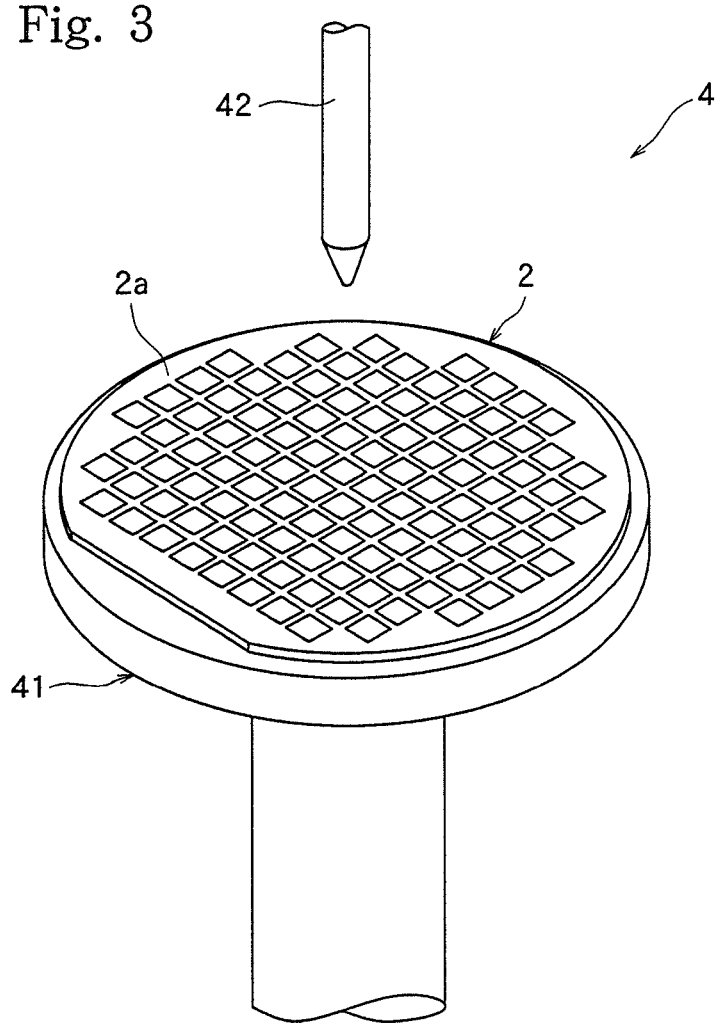
FIG. 3 is an explanation drawing showing an embodiment of a protective film formation step in the wafer processing method according to the present invention.
Figure 4:
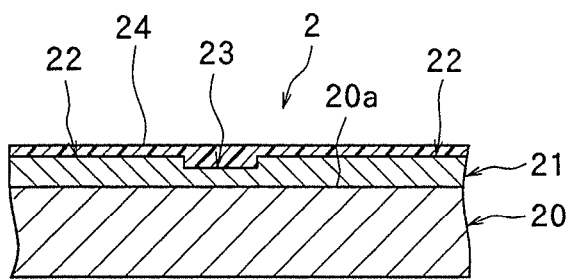
FIG. 4 is an enlarged sectional view of essential parts of the semiconductor wafer having a protective film formed thereon by the protective film formation step shown in FIG. 3.

In this protective film formation step, the protective film agent is coated on the face 2a of the semiconductor wafer 2 by a spin coater 4 as shown in FIG. 3. The spin coater 4 is furnished with a chuck table 41 having suction/holding means, and a nozzle 42 disposed above the center of the chuck table 41. The semiconductor wafer 2 is laid, with its face 2a pointed upward, on the chuck table 41 and, with the chuck table 41 being rotated, the protective film agent in liquid form is dripped through the nozzle 42 onto the center of the face of the semiconductor wafer 2. By this procedure, the liquid protective film agent flows to an outer peripheral portion of the semiconductor wafer 2 under centrifugal force, covering the face of the semiconductor wafer 2. The liquid protective film agent is moderately heated to be dried, whereby a protective film 24 with a thickness of the order of 0.1 to 5 μm (thickness on the street 23) is formed on the face 2a of the semiconductor wafer 2, as shown in FIG. 4.

Figure 5:
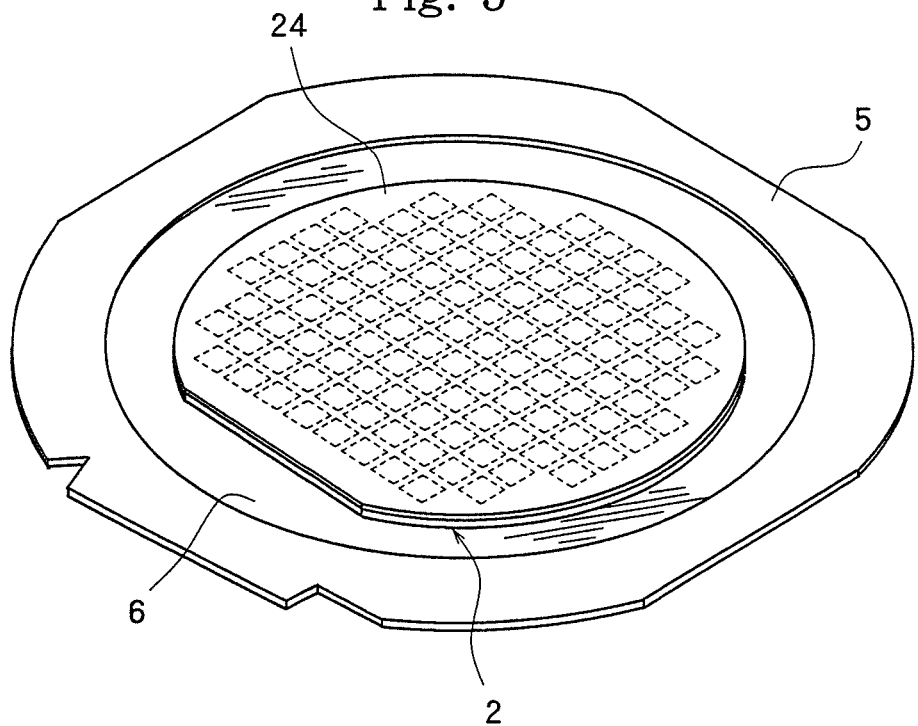
FIG. 5 is a perspective view showing a state in which the semiconductor wafer having the protective film formed thereon is supported by an annular frame via a protective tape.

Once the protective film 24 is formed in this manner on the face 2a of the semiconductor wafer 2, a protective tape 6 mounted on an annular frame 5 is stuck to the back of the semiconductor wafer 2, as shown in FIG. 5.

Then, the face 2a (streets 23) of the semiconductor wafer 2 is irradiated with laser light through the protective film 24. This laser light irradiation or application step is performed using a laser processing apparatus as shown in FIGS. 6 to 8.

Figure 6:
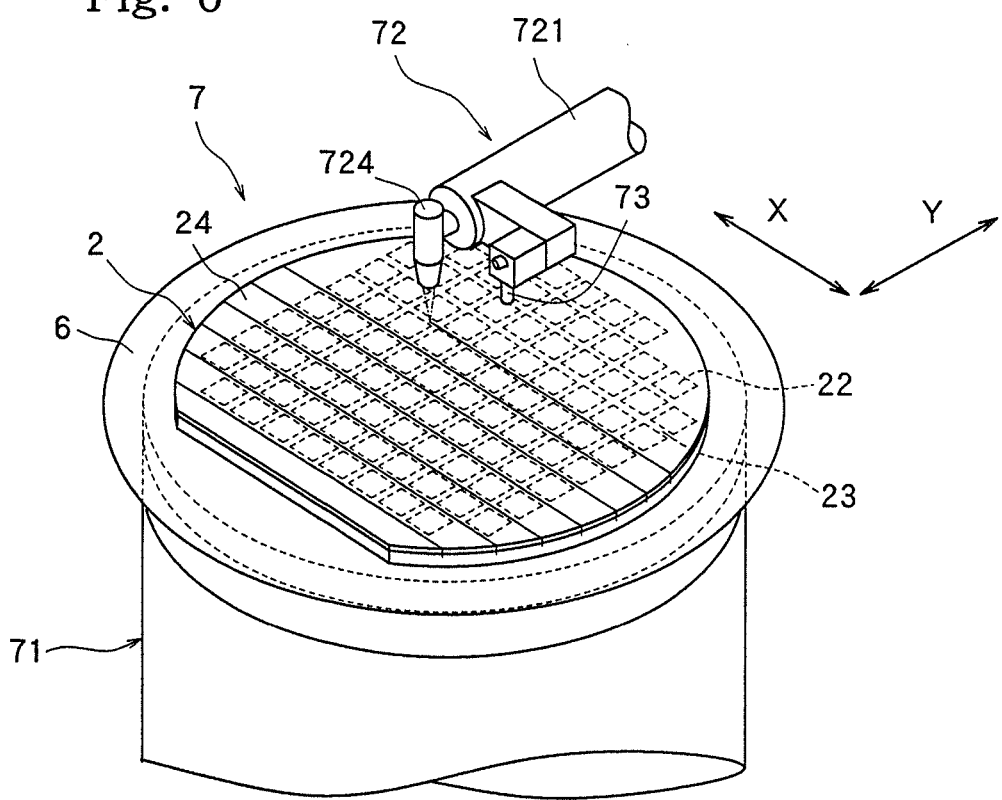
FIG. 6 is a perspective view of essential parts of a laser processing apparatus for performing a laser light application step in the wafer processing method according to the present invention.
Figure 7:
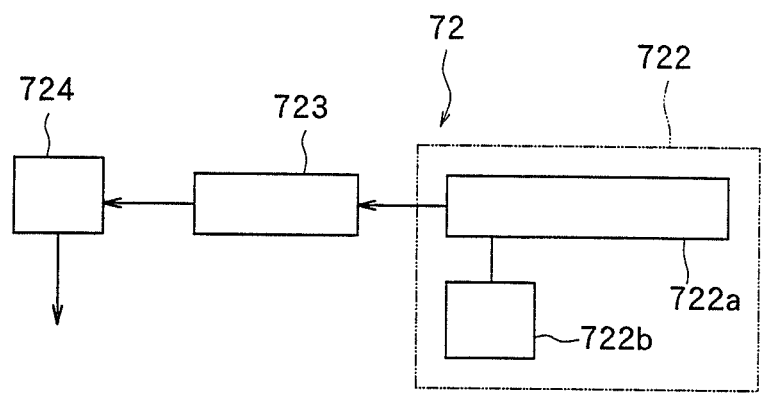
FIG. 7 is a block diagram schematically showing the configuration of laser light application means installed in the laser processing apparatus shown in FIG. 6.
Figure 8:
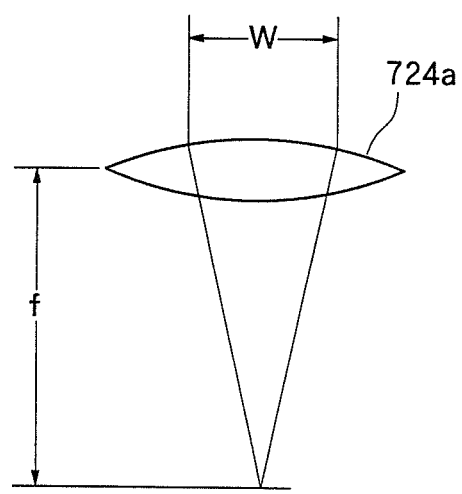
FIG. 8 is a schematic view for illustrating the focus spot diameter of laser light.

The laser processing apparatus 7 shown in FIGS. 6 to 8 comprises a chuck table 71 for holding a workpiece, laser light application means 72 for applying laser light to the workpiece held on the chuck table 71, and imaging means 73 for imaging the workpiece held on the chuck table 71. The chuck table 71 is constructed so as to suck and hold the workpiece, and is moved by a moving mechanism (not shown) in a processing feed direction indicated by an arrow X and an indexing feed direction indicated by an arrow Y in FIG. 6.

As shown in FIG. 7, the laser light application means 72 includes a cylindrical casing 721 disposed substantially horizontally. Pulsed laser light oscillation means 722 and a transmission optical system 723 are disposed within the casing 721. The pulsed laser light oscillation means 722 is composed of a pulsed laser light oscillator 722a comprising a YAG laser oscillator or a YVO4 laser oscillator, and a pulse repetition frequency setting means 722b annexed thereto. The transmission optical system 723 includes a suitable optical element such as a beam splitter. A focusing device 724 accommodating condenser lenses (not shown) composed of a lens assembly, which may itself be in a well-known shape, is mounted at the front end of the casing 721. Laser light, oscillated by the pulsed laser light oscillation means 722, arrives at the focusing device 724 via the transmission optical system 723, and is directed from the focusing device 724 at the workpiece, which is held on the chuck table 71, with a predetermined focus spot diameter D.

The focus spot diameter D is defined by the following equation, if pulsed laser light showing Gaussian distribution is applied through an objective focusing lens 724a of the focusing device 724 as shown in FIG. 8:

$$D(\mu m)=4\times\lambda\times f/(\pi\times W)$$

where λ represents the wavelength (μm) of a pulsed laser beam,

W represents the diameter (mm) of pulsed laser light incident on the objective focusing lens 724a, and f represents the focal length (mm) of the objective focusing lens 724a.

The imaging means 73, mounted at a front end portion of the casing 721 constituting the laser light application means 72, is composed of an infrared illumination means for directing infrared rays at the workpiece, an optical system for catching infrared rays applied by the infrared illuminations means, and an imaging device (infrared CCD) for outputting an electrical signal corresponding to the infrared rays caught by the optical system, in addition to an ordinary imaging device (CCD) for taking an image with the use of visible rays, in the illustrated embodiment. The imaging means 73 sends image signals obtained to a control means (not shown).

The laser light application step to be performed using the above-described laser processing apparatus 7 will be described with reference to FIG. 6 and FIGS. 9(a), 9(b) to 11.

In this laser light application step, the semiconductor wafer 2 is laid on the chuck table 71 of the laser processing apparatus 7 shown in FIG. 6, with the side, where the protective film 24 is formed, being pointed upward. In this condition, the semiconductor wafer 2 is attracted to and held on the chuck table 71. In FIG. 6, the annular frame 5, on which the protective tape 6 is mounted, is not shown. However, the annular frame 5 is held by a suitable frame holding means disposed on the chuck table 71.

The chuck table 71 sucking and holding the semiconductor wafer 2 as mentioned above is positioned directly below the imaging means 73 by the moving mechanism (not shown). When the chuck table 71 is located directly below the imaging means 73, an alignment operation for detecting the processing zone of the semiconductor wafer 2 to be laser-processed is carried out by the imaging means 73 and the control means (not shown). That is, the imaging means 73 and the control means (not shown) perform image processing, such as pattern matching, for aligning the street 23, formed in the predetermined direction of the semiconductor wafer 2, with the focusing device 724 of the laser light application means 72 for applying laser light along the street 23, thereby implementing alignment of the laser light application position. For the street 23 extending perpendicularly to the above predetermined direction of the semiconductor wafer 2, alignment of the laser light application position is performed similarly. At this time, the protective film 24 basically opaque is formed on the face 2a of the semiconductor wafer 2, where the streets 23 are formed, but the street 23 can be imaged with infrared rays and alignment can be performed from above the face 2a.

Figure 9:
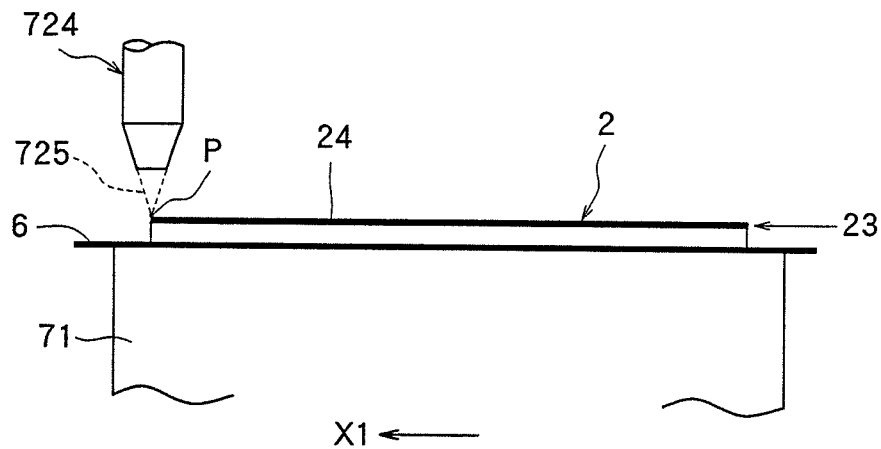
FIGS. 9(a) and 9(b) are explanation drawings of the laser light application step in the wafer processing method according to the present invention.
Figure 9:
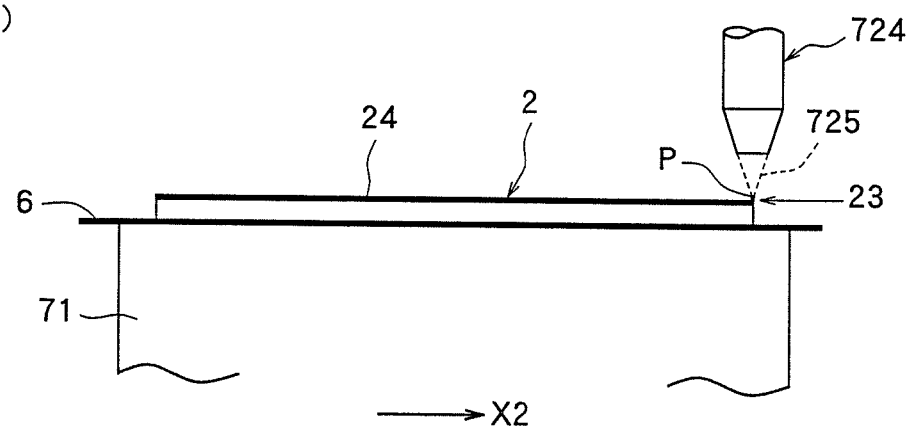

In the manner described above, the street 23 formed on the semiconductor wafer 2 held on the chuck table 71 is detected, and the alignment of the laser light application position is carried out. Upon completion of alignment, the chuck table 71 is moved to a laser light application zone where the focusing device 724 of the laser light application means 72 is located, as shown in FIG. 9(a). In the laser light application zone, one end (left end in FIG. 9) of the predetermined street 23 is positioned directly below the focusing device 724 of the laser light application means 72. With pulsed laser light 725 being applied from the focusing device 724, the chuck table 71, namely, the semiconductor wafer 2, is moved at a predetermined feed speed in a direction indicated by an arrow X1 in FIG. 9(a). When the application position of the laser light application means 7 reaches the position of the other end (right end in FIGS. 9(a), 9(b)) of the street 23, as shown in FIG. 9(b), application of the pulsed laser light 725 is stopped, and the movement of the chuck table 71, namely, the semiconductor wafer 2, is terminated.

Then, the chuck table 71, namely, the semiconductor wafer 2, is moved by about 10 to 20 μm in a direction perpendicular to the sheet face of the drawing (i.e., in the indexing feed direction). Then, with pulsed laser light 725 being applied from the laser light application means 72, the chuck table 71, namely, the semiconductor wafer 2, is moved at a predetermined feed speed in a direction indicated by an arrow X2 in FIG. 9(b). When the laser light application means 72 reaches the position shown in FIG. 9(a), application of the pulsed laser light 725 is stopped, and the movement of the chuck table 71, namely, the semiconductor wafer 2, is terminated.

Figure 10:
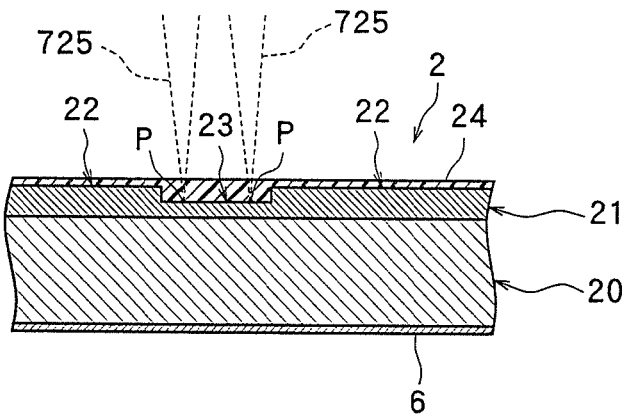
FIG. 10 is an explanation drawing showing the position of laser light application in the laser light application step of the wafer processing method according to the present invention.

As described above, during the reciprocating movement of the chuck table 71, namely, the semiconductor wafer 2, the pulsed laser light 725 is applied to the street 23, with its focus spots P in alignment with areas in the vicinity of the upper surface of the street 23, the spacing between P's being wider than the width of a cutting blade (to be described later), as shown in FIG. 10.

Figure 11:
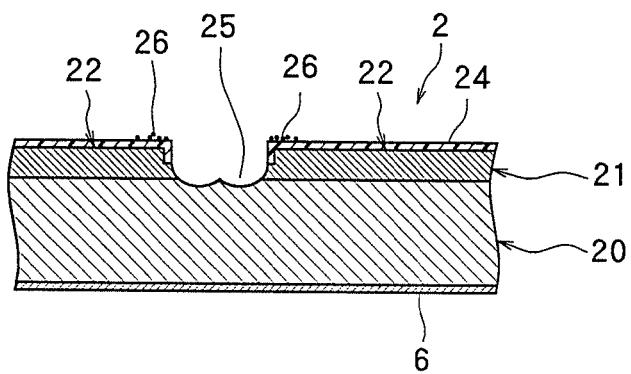
FIG. 11 is an enlarged sectional view of essential parts of the semiconductor wafer showing a laser-processed groove formed in the semiconductor wafer by the laser light application step in the wafer processing method according to the present invention.

The laser light application step is performed, for example, under the following processing conditions:
Source of laser light: YVO4 laser or YAG laser
Wavelength: 355 nm
Pulse repetition frequency: 50 to 100 kHz
Output: 0.3 to 4.0 W
Focus spot diameter: 9.2 μm
Processing feed speed: 1 to 800 mm/second By performing the above-described laser light application step, a laser-processed groove 25 having a larger width than the width of the cutting blade (to be described later) is formed along the street 23 in the laminate 21 of the semiconductor wafer 2 where the street 23 has been formed, as shown in FIG. 11. The laser-processed groove 25 reaches the semiconductor substrate 20 to remove the laminate 21. When, in this laser light application step, the pulsed laser light 725 is applied via the protective film 24 to the laminate 21 having the street 23 formed therein, thermal decomposition of the protective film 24 occurs nearly simultaneously with (or prior to) the thermal decomposition of the laminate 21 and the semiconductor substrate 20, since the protective film 24 has a high laser light absorption capacity. As a result, film rupture takes place at the site of laser application. That is, the protective film 24 becomes the starting point of processing. After the starting point of processing is formed in the protective film 24 in this manner, or nearly at the same time as the formation of the starting point of processing, the laminate 21 and the semiconductor substrate 20 are processed by application of the pulsed laser light 725. Thus, the protective film 24 is prevented from being peeled off under the pressure of a vapor of the thermal decomposition product of the laminate 21 or the semiconductor substrate 20. Hence, the deposition of debris onto the peripheral edge portion of the semiconductor chip 22 due to such peeling of the protective film 24 can be effectively prevented. Furthermore, the adhesion of the protective film 24 to the wafer face 20a (face of the semiconductor chip 22) is so high that the peeling of the protective film 24 during processing, for example, minimally occurs. Consequently, the deposition of debris due to such peeling of the protective film 24 is effectively avoided. That is, as shown in FIG. 11, since the above-mentioned protective film 24 is formed, debris 26 deposits on the surface of the protective film 24, and does not deposit on the semiconductor chips 22. Accordingly, deterioration of the quality of the semiconductor chips 22 due to deposition of the debris 26 can be avoided effectively.

After the laser light application step is carried out along the street in the above manner, the chuck table 71, accordingly, the semiconductor wafer 2 held thereon, is indexed by a spacing between the streets in a direction indicated by an arrow Y (indexing step), and the laser light application step is performed again. After the laser light application step and the indexing step are performed in this manner for all the streets extending in the predetermined direction, the chuck table 71, accordingly, the semiconductor wafer 2 held thereon, is turned 90 degrees. Then, the laser light application step and the indexing step are performed, as above, along each street extending perpendicularly to the above predetermined direction, whereby the laser-processed grooves 25 can be formed in all the streets 23 formed in the semiconductor wafer 2.

Figure 12:
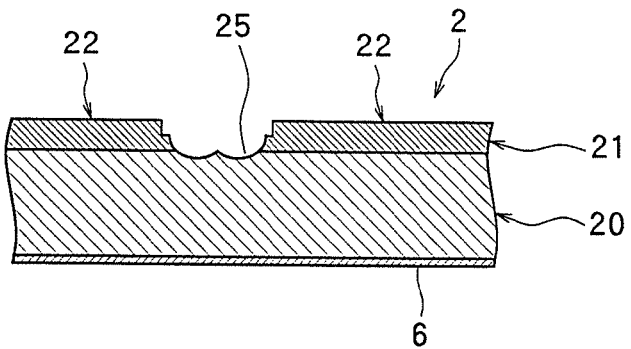
FIG. 12 is an enlarged sectional view of the essential parts of the semiconductor wafer showing a state in which the protective film coated on the face of the semiconductor wafer has been removed by a protective film removal step in the wafer processing method according to the present invention.

Then follows the removal of the protective film 24 coated on the face 2a of the semiconductor wafer 2 stuck to the protective tape 6 mounted on the annular frame 5. For this protective film removal step, the protective film 24 can be washed off with water (or hot water) as shown in FIG. 12, because the protective film 24 has been formed from the water-soluble resin (the other component is also water-soluble), as stated earlier. At this time, the debris 26 on the protective film 24 generated during the aforementioned laser light application step is also washed away along with the protective film 24. As shown here, removal of the protective film 24 can be performed very easily.

Figure 13:
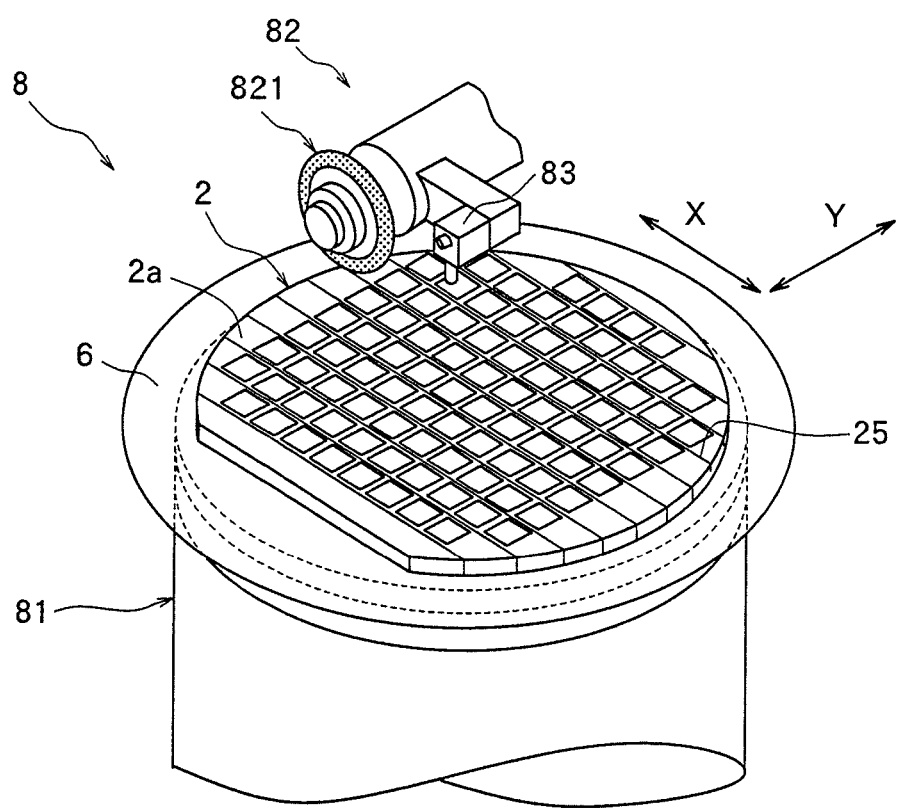
FIG. 13 is a perspective view of essential parts of a cutting device for performing a cutting step in the wafer processing method according to the present invention.
Figure 14:
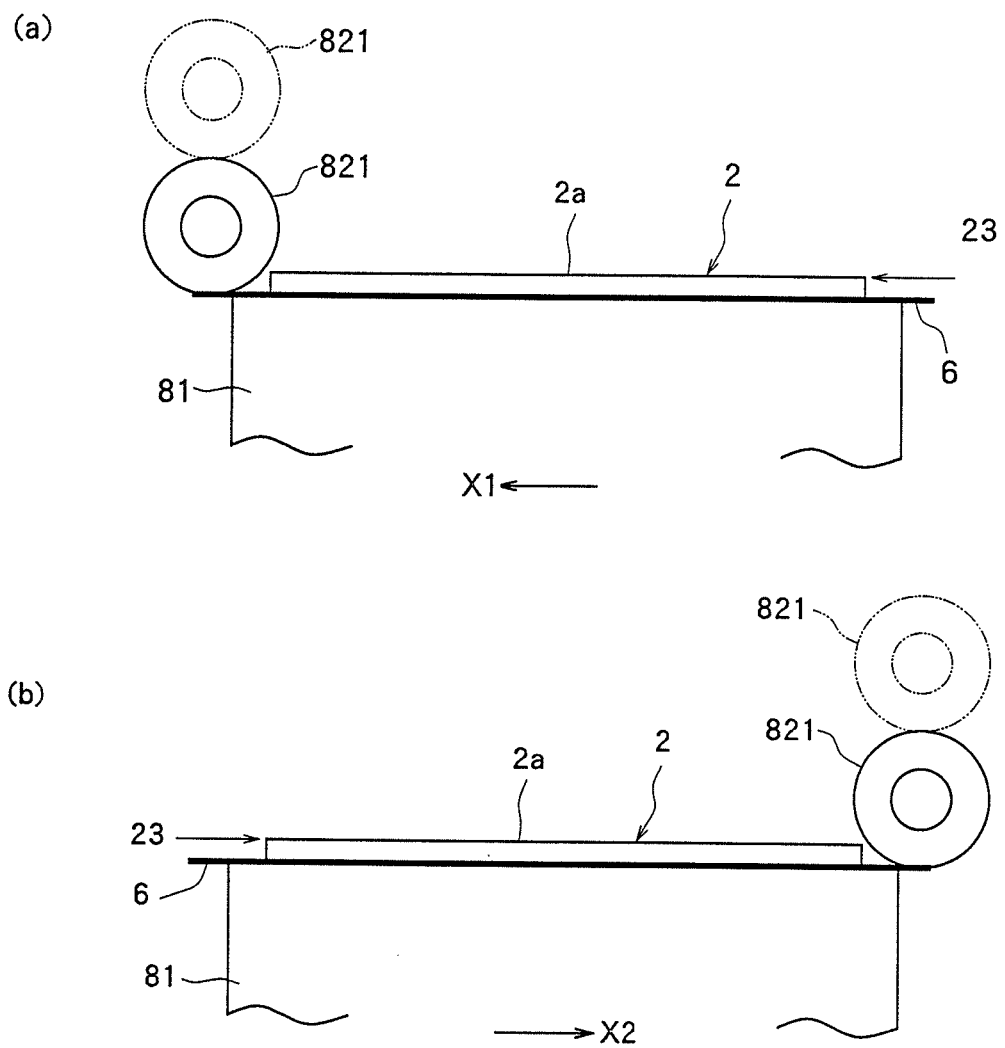
FIGS. 14(a) and 14(b) are explanation drawings of the cutting step in the wafer processing method according to the present invention.
Figure 15:
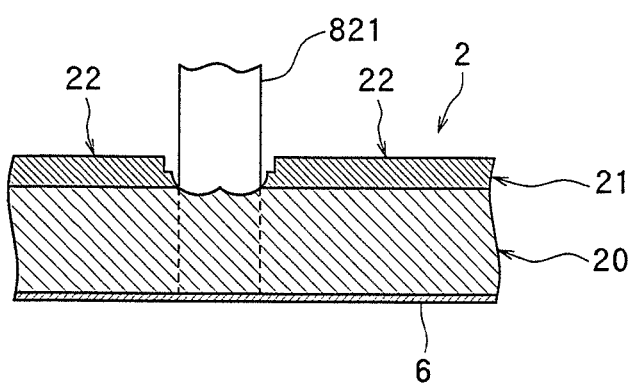
FIGS. 15(a) and 15(b) are explanation drawings showing a state in which the semiconductor wafer is cut along the laser-processed groove by the cutting step in the wafer processing method according to the present invention.
Figure 15:
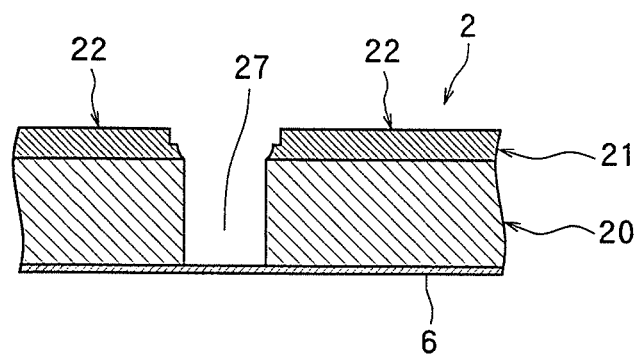

After the protective film 24 is removed in the above manner, a cutting step is performed for cutting the semiconductor wafer 2 along the laser-processed grooves 25 formed in the streets 23 of the semiconductor wafer 2. This cutting step can be carried out using a cutting device 8, which is generally used as a dicing device, as shown in FIG. 13. The cutting device 8 comprises a chuck table 81 equipped with suction/holding means, cutting means 82 furnished with a cutting blade 821, and imaging means 83 for imaging the workpiece held on the chuck table 81.

The cutting step to be performed using the above-described cutting device 8 will be described with reference to FIGS. 13 to 15(a), 15(b).

The semiconductor wafer 2 deprived of the protective film 24 is laid on the chuck table 81 of the cutting device 6, with the face 2a of the semiconductor wafer 2 being pointed upward, as shown in FIG. 13. In this condition, the semiconductor wafer 2 is held on the chuck table 81 by suction means (not shown). The chuck table 81 sucking and holding the semiconductor wafer 2 is positioned directly below the imaging means 83 by a moving mechanism (not shown).

When the chuck table 81 is located directly below the imaging means 83, an alignment operation for detecting a zone of the semiconductor wafer 2 to be cut is carried out by the imaging means 83 and control means (not shown). That is, the imaging means 83 and the control means (not shown) perform image processing, such as pattern matching, for aligning the street 23, formed in the predetermined direction of the semiconductor wafer 2, with the cutting blade 821 for cutting the semiconductor wafer 2 along the laser-processed groove 25, thereby implementing alignment of the cutting zone. For the street 23 extending perpendicularly to the above predetermined direction of the semiconductor wafer 2, alignment of the cutting zone is performed similarly.

In the manner described above, the street 23 formed on the semiconductor wafer 2 held on the chuck table 81 is detected, and the alignment of the cutting zone is carried out. Upon completion of this alignment, the chuck table 81 holding the semiconductor wafer 2 is moved to a cutting start position in the cutting zone. At this time, the semiconductor wafer 2 is positioned such that one end (left end in FIGS. 14(a), 14(b)) of the street 23 to be cut is positioned rightwardly, by a predetermined amount, of a position directly below the cutting blade 821, as shown in FIG. 14(a). The semiconductor wafer 2 is also positioned such that the cutting blade 821 is located at the center of the laser-processed groove 25 formed in the street 23.

When the chuck table 81, namely, the semiconductor wafer 2, has been brought to the cutting start position in the cutting zone, the cutting blade 821 is moved downward in a depth setting motion from a standby position indicated by double-dotted chain lines in FIG. 14(a), and is thereby brought to a predetermined infeed position as indicated by solid lines in FIG. 14(a). This infeed position is set such that the lower end of the cutting blade 821 reaches the protective tape 6 stuck to the back of the semiconductor wafer 2, as shown in FIG. 14(a) and FIG. 15(a).

Then, the cutting blade 821 is rotated at a predetermined rotational speed, and the chuck table 81, namely, the semiconductor wafer 2, is moved at a predetermined cutting feed speed in a direction indicated by an arrow X1 in FIG. 14(a). When the chuck table 81, namely, the semiconductor wafer 2, comes to such a position that the other end (right end in FIGS. 14(a) and 14(b)) of the street 23 is located a predetermined amount leftwardly of the position directly below the cutting blade 821, as shown in FIG. 14(b), the movement of the chuck table 81, namely, the semiconductor wafer 2, is stopped. By so feeding the chuck table 81, namely, the semiconductor wafer 2, for feeding, a cut groove 27 reaching the back of the semiconductor wafer 2 is formed along the laser-processed groove 25 formed in the street 23, whereby the semiconductor wafer 2 is cut, as shown in FIG. 15(b). In this cutting step, only the semiconductor substrate 20 is cut by the cutting blade 821. This can prevent the peeling of the laminate 21 which is caused by cutting the laminate 21, formed on the face of the semiconductor substrate 20, by the cutting blade 821.

The above-described cutting step is performed, for example, under the following conditions:
  Cutting blade: Outer diameter 52 mm, thickness 20 μm
  Rotational speed of cutting blade: 30,000 rpm
  Cutting feed speed: 50 mm/second Then, the cutting blade 821 is brought to a standby position indicated by dashed double-dotted lines in FIG. 14(b), and the chuck table 81, namely, the semiconductor wafer 2, is moved in a direction indicated by an arrow X2 in FIG. 14(b) until it is returned to the position shown in FIG. 14(a). Then, the chuck table 81, namely, the semiconductor wafer 2, is indexed, by an amount corresponding to the spacing between the streets 23, in a direction perpendicular to the sheet face in the drawing (i.e., in an indexing feed direction), whereby the street 23 to be cut next is brought to the position opposed to the cutting blade 821. When the street 23 to be cut next has been located at the position opposed to the cutting blade 821, the above-described cutting step is performed.

The foregoing cutting step is performed for all the streets 23 formed in the semiconductor wafer 2. As a result, the semiconductor wafer 2 is cut along the laser-processed grooves 25 formed in the streets 23, and is thereby separated into individual semiconductor chips 20. In the cutting step, cutting is carried out, with cutting water (pure water) being supplied. Thus, the protective film 24 can be removed by cutting water supplied, without the need to provide the aforementioned protective film removal step individually. As noted here, the cutting step may be performed while concurrently serving as the protective film removal step.

While the wafer processing method of the present invention has been described based on the embodiments in which the semiconductor wafer is divided, it is to be understood that the present invention can be applied to various types of laser processing for other wafers. For example, the present invention can be applied to the division of optical device wafers.

EXAMPLES

The specifications for the laser processing apparatus used in the following examples are as follows:
Source of laser light: YVO4 laser
Wavelength: 355 nm
Pulse repetition frequency: 50 to 100 kHz
Output: 0.3 to 4.0 W
Focus spot diameter: 9.2 μm
Processing feed speed: 1 to 800 mm/second

Example 1

A protective film agent of the following composition was prepared:
Water-soluble resin: 20 g
Polyvinyl alcohol having a saponification degree of 88% and a polymerization degree of 300
Water-soluble laser light absorber: 0.2 g
Ferulic acid
Water: 80 g
g absorption coefficient k of the solids=$1.56 \times 10^{-1}$ The above protective film agent was coated on a silicon wafer by a spinner, and dried to form a protective film having a thickness on the street of 0.5 to 1.5 μm. Then, the silicon wafer having the protective film formed thereon was mounted on the laser processing apparatus complying with the above specifications, and was subjected to laser processing. Then, the protective film was washed off with pure water, and the surroundings of the laser scans were observed. Bulges of the edge areas were observed, but no deposition of debris on the surroundings was noted. Thus, the silicon wafer was at a usable level. The width of processing was comparable to the laser spot diameter without having influence from the thickness of the coating film.

Example 2

A protective film agent was prepared in exactly the same manner as in Example 1, except that the amount of ferulic acid, a water-soluble laser light absorber, was changed to 0.8 g. The g absorption coefficient k of the solids of the protective film agent was $5.61 \times 10^{-1}$.

Using the above protective film agent, a protective film having a thickness of 0.2 μm was formed on a silicon wafer in the same manner as in Example 1. Laser processing was performed in the same manner, and the protective film was washed off with water. Observation of the surroundings of the laser scans, which was made in the same manner as in Example 1, showed no deposition of debris. The width of processing was slightly larger than the laser spot diameter, but the silicon wafer was at a usable level.

Example 3

A protective film agent was prepared in the same manner as in Example 1, except that polyvinyl alcohol having a saponification degree of 75% and a polymerization degree of 500 was used as the water-soluble resin. The g absorption coefficient k of the solids of the protective film agent was $1.56 \times 10^{-1}$ as in Example 1.

Using the above protective film agent, a protective film having a thickness of 0.5 to 1.5 μm was formed on a silicon wafer in the same manner as in Example 1. Laser processing was performed in the same manner, and the protective film was washed off with water. Observation of the surroundings of the laser scans, which was made in the same manner as in Example 1, showed no deposition of debris. The width of processing was comparable to the laser spot diameter without having influence from the thickness of the coating film.

Example 4

A protective film agent was prepared in exactly the same manner as in Example 3, except that a water-soluble monoazo dye (AIZEN SWTW3, Hodogaya Chemical Co., Ltd.) was used, instead of ferulic acid, as the water-soluble laser light absorber. The g absorption coefficient k of the solids of the protective film agent was $7.9 \times 10^{-2}$.

Using the above protective film agent, a protective film having a thickness of 0.5 to 1.5 μm was formed on a silicon wafer in the same manner as in Example 1. Laser processing was performed in the same manner, and the protective film was washed off with water. Observation of the surroundings of the laser scans, which was made in the same manner as in Example 1, showed no deposition of debris. The width of processing was comparable to the laser spot diameter without having influence from the thickness of the coating film.

Example 5

A protective film agent was prepared in exactly the same manner as in Example 5, except that 15 g of glycerin was added as a plasticizer. The g absorption coefficient k of the solids of the protective film agent was $7.9 \times 10^{-2}$ as in Example 5.

Using the above protective film agent, a protective film having a thickness of 0.5 to 1.5 μm was formed on a silicon wafer in the same manner as in Example 1. Laser processing was performed in the same manner, and the protective film was washed off with water. Observation of the surroundings of the laser scans, which was made in the same manner as in Example 1, showed no deposition of debris. The width of processing was comparable to the laser spot diameter without having influence from the thickness of the coating film.

Comparative Example 1

A protective film agent was prepared in exactly the same manner as in Example 1, except that ferulic acid, a water-soluble laser light absorber, was not used. The g absorption coefficient k of the solids of the protective film agent was $1.94 \times 10^{-3}$.

Using the above protective film agent, a protective film having a thickness of 0.5 to 1.5 μm was formed on a silicon wafer in the same manner as in Example 1. Laser processing was performed in the same manner, and the protective film was washed off with water. Observation of the surroundings of the laser scans, which was made in the same manner as in Example 1, showed marked deposition of debris, and peeling of the film.

What we claim is:
1. A protective film agent for laser dicing, comprising a solution having, dissolved therein, a water-soluble resin and at least one water-soluble laser light absorber selected from the group consisting of a water-soluble dye, a water-soluble coloring matter, and a water-soluble ultraviolet absorber, wherein
    solids of the solution have a g absorption coefficient, k, for laser light with a wavelength of 355 nm, within a range of $3\times10^{-3}$ to $2.5\times10^{-1}$ abs·L/g (abs: absorbance), and
    the laser light absorber is contained in an amount of 0.01 to 10 parts by weight based on 100 parts by weight of the water-soluble resin.

2. A processing method for a wafer, comprising:
    coating a surface of the wafer, which is to be processed, with the protective film agent for laser dicing according to claim 1, followed by drying, to form a protective film; and
    irradiating the surface, which is to be processed, with laser light via the protective film to perform processing.

3. The processing method according to claim 2, wherein a wavelength of the laser light is 355 nm.

4. The processing method according to claim 2, wherein a plurality of semiconductor chips partitioned by streets arranged in a lattice pattern are formed in the wafer, and the streets are irradiated with the laser light via the protective film to form grooves.

5. The processing method according to claim 2, wherein the protective film is removed by washing with water after irradiation with the laser light.

\* \* \* \* \*